United States Patent
Lee et al.

(10) Patent No.: US 9,431,239 B1
(45) Date of Patent: Aug. 30, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chiu-Te Lee, Hsinchu County (TW); Ke-Feng Lin, Taipei (TW); Nien-Chung Li, Hsinchu (TW); Ching-Nan Hwang, Taichung (TW); Shih-Teng Huang, Taichung (TW); Ming-Yen Liu, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/809,278

(22) Filed: Jul. 26, 2015

(30) Foreign Application Priority Data

Jun. 17, 2015 (CN) .......................... 2015 1 0336284

(51) Int. Cl.
| | | |
|---|---|---|
| *H01L 21/02* | (2006.01) | |
| *H01L 21/225* | (2006.01) | |
| *H01L 21/311* | (2006.01) | |
| *H01L 21/283* | (2006.01) | |
| *H01L 29/66* | (2006.01) | |
| *H01L 29/78* | (2006.01) | |
| *H01L 29/06* | (2006.01) | |
| *H01L 29/167* | (2006.01) | |
| *H01L 29/49* | (2006.01) | |
| *H01L 29/423* | (2006.01) | |

(52) U.S. Cl.
CPC ... *H01L 21/02238* (2013.01); *H01L 21/02255* (2013.01); *H01L 21/2253* (2013.01); *H01L 21/283* (2013.01); *H01L 21/31111* (2013.01); *H01L 29/0653* (2013.01); *H01L 29/167* (2013.01); *H01L 29/4236* (2013.01); *H01L 29/495* (2013.01); *H01L 29/66545* (2013.01); *H01L 29/78* (2013.01)

(58) Field of Classification Search
CPC .................. H01L 21/02238; H01L 21/02255; H01L 21/2253; H01L 21/283; H01L 21/31111; H01L 29/0653; H01L 29/167; H01L 29/4236; H01L 29/495; H01L 29/66545; H01L 29/78
USPC .......................................................... 257/401
See application file for complete search history.

(56) References Cited

U.S. PATENT DOCUMENTS

| | | | |
|---|---|---|---|
| 6,147,008 A | 11/2000 | Chwa et al. | |
| 8,722,485 B1* | 5/2014 | Tong ................. | H01L 21/28167 257/E21.625 |
| 2001/0046762 A1* | 11/2001 | Ito ..................... | H01L 21/31055 438/589 |
| 2003/0157778 A1* | 8/2003 | Hemmenway ........ | H01L 21/763 438/385 |
| 2012/0261672 A1* | 10/2012 | Chidambarrao ............. | H01L 21/823412 257/77 |
| 2012/0261675 A1* | 10/2012 | Casady ................. | H01L 29/402 257/77 |

OTHER PUBLICATIONS

Chen et al., Title of Invention: Method for Forming High Voltage Transistor, U.S. Appl. No. 14/727,875, filed Jun. 2, 2015.

* cited by examiner

*Primary Examiner* — Fernando L Toledo
*Assistant Examiner* — Adam S Bowen
(74) *Attorney, Agent, or Firm* — Winston Hsu; Scott Margo

(57) ABSTRACT

A method for fabricating semiconductor device is disclosed. The method includes the steps of: providing a substrate; forming a doped region in the substrate; forming a thermal oxide layer on the substrate and the doped region; removing the thermal oxide layer to form a first recess; forming an epitaxial layer on the substrate and in the first recess; and forming a gate dielectric layer in the epitaxial layer.

18 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of forming gate dielectric layer on a substrate of high-voltage region.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal gate transistor, as gate dielectric layer on high-voltage region typically protrudes from the substrate surface, the metal gate formed on high-voltage region afterwards also becomes higher than the metal gate formed on low-voltage region. Consequently, a large portion of the metal gate on high-voltage region is lost by chemical mechanical polishing (CMP) process conducted thereafter. Hence, how to resolve this issue has become an important task in this field.

SUMMARY OF THE INVENTION

According to a preferred embodiment of the present invention, a method for fabricating semiconductor device is disclosed. The method includes the steps of: providing a substrate; forming a doped region in the substrate; forming a thermal oxide layer on the substrate and the doped region; removing the thermal oxide layer to form a first recess; forming an epitaxial layer on the substrate and in the first recess; and forming a gate dielectric layer in the epitaxial layer.

According to another aspect of the present invention, a semiconductor device is disclosed. The semiconductor device includes: a substrate; a recess in the substrate; an epitaxial layer in the recess and on the substrate, in which the epitaxial layer includes a first portion embedded in the recess and a second portion on the substrate; and a gate dielectric layer on the first portion of the epitaxial layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
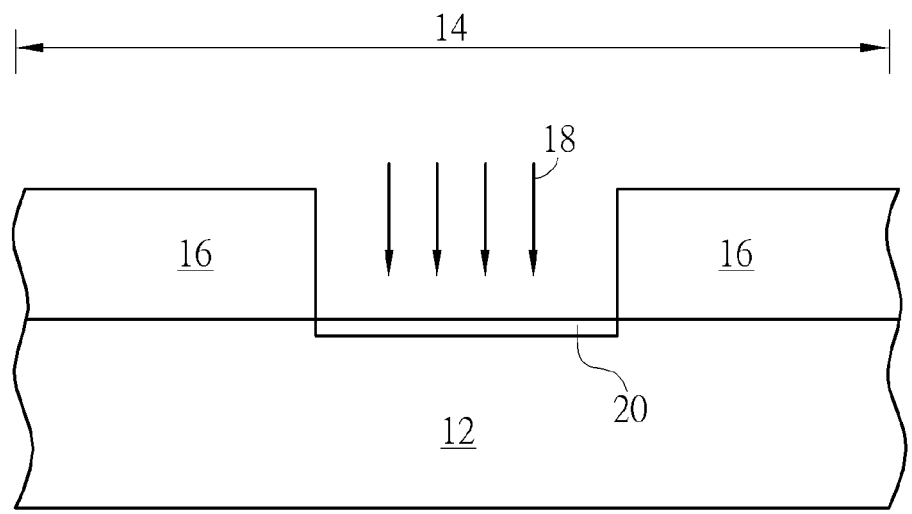
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12, such as a silicon substrate or silicon-on-insulator (SOI) substrate is provided. A device region, such as a high-voltage region (or HV region 14) is defined on the substrate 12, in which a high-voltage semiconductor device is preferably fabricated in the HV region 14 in the later process. Next, a patterned mask 16 is used to conduct an ion implantation process 18 to form at least a doped region 20 in the substrate 12. In this embodiment, the ions implanted through the ion implantation process 18 preferably include n-type dopants, such as dopants selected from the group consisted of antimony (Sb) or arsenic (As), and the doped region 20 is preferably an n+ buried layer (NBL). It should be noted that even though only one single doped region 20 is disclosed in this embodiment, the quantity of the doped region 20 is not limited to one, but could be adjusted to the demand of the product.

Figure 2:
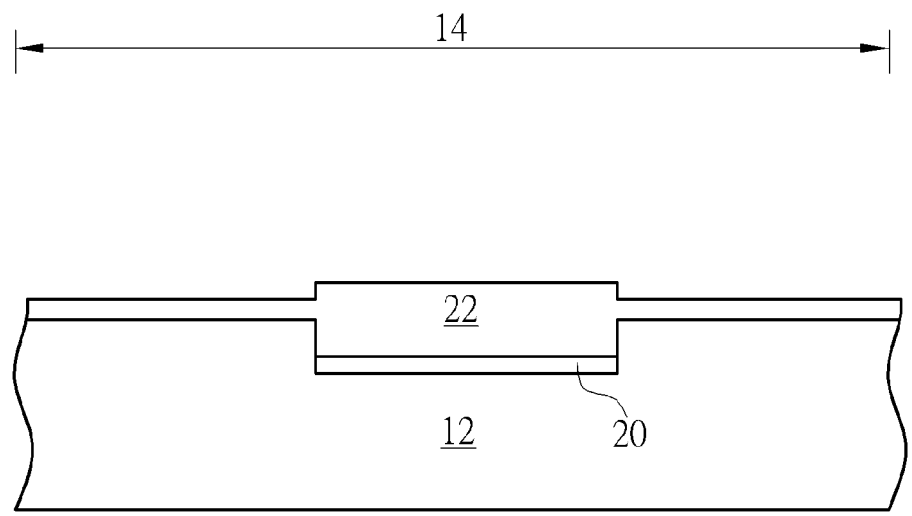

Next, as shown in FIG. 2, the patterned mask 16 is removed and a thermal oxidation process is conducted to form a thermal oxide layer 22 on the substrate 12 to cover the doped region 20. In this embodiment, the temperature of the thermal oxidation process is preferably greater than 1000° C., and the formation of the thermal oxide layer 22 preferably pushes the doped region 20 downward so that the top surface of the doped region 20 is lower than the top surface of the substrate 12 around the doped region 20. It should also be noted that the region doped by ion implantation process preferably reveals faster oxidation growth so that during the thermal oxidation process, the thermal oxide layer 22 directly on top of the doped region 20 is preferably thicker than the thermal oxide layer 22 on the substrate 12 around the doped region 20. For instance, the thickness of the thermal oxide layer 22 directly above the doped region 20 is approximately 800 Angstroms and the thickness of the thermal oxide layer 22 around the doped region 20 is approximately lower than 400 Angstroms, or more preferably 300-400 Angstroms.

Figure 3:
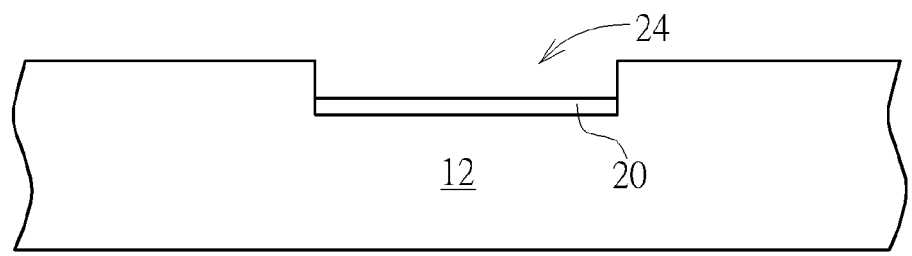

Next, as shown in FIG. 3, an etching or wet clean process is conducted by using etchant such as hydrofluoric acid to remove the thermal oxide layer 22 and expose the doped region 20 underneath, in which a first recess 24 is formed in the substrate 12 above the doped region 20 after thermal oxide layer 22 is removed. In this embodiment, the depth of first recess 24, or the vertical distance from the top surface of the doped region 20 to the top surface of substrate 12 is approximately 380 Angstroms to 420 Angstroms, or more preferably 400 Angstroms.

Figure 4:
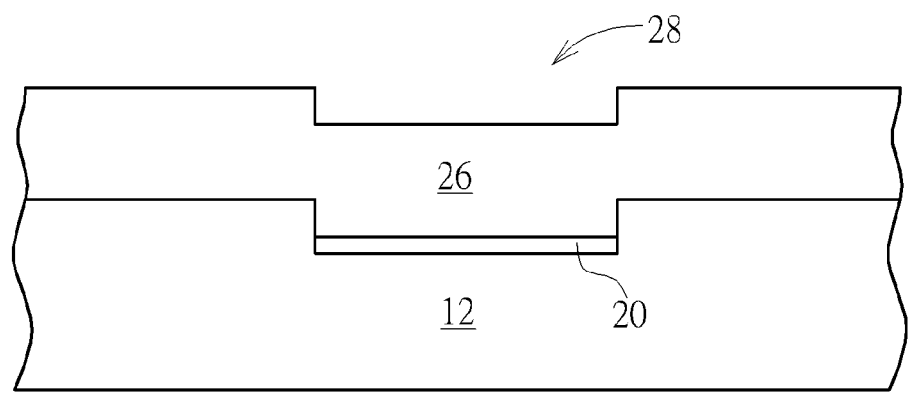

Next, as shown in FIG. 4, a selective cleaning process could be conducted to remove impurities or native oxides remained in the first recess 24 or on substrate 12 surface, and an epitaxial layer 26 is formed on the substrate 12 and into the first recess 24. Preferably, a second recess 28 corresponding to the first recess 24 is formed in the epitaxial layer 26 directly above the doped region 20 as the epitaxial layer 26 is formed on the substrate 12 and filled into the first recess 24, in which the depth of the second recess 28 is substantially equivalent to the depth of the first recess 24 shown in FIG. 3. For instance, the depth of the second recess 28 is approximately 380 Angstroms to 420 Angstroms, or more preferably 400 Angstroms.

Figure 5:
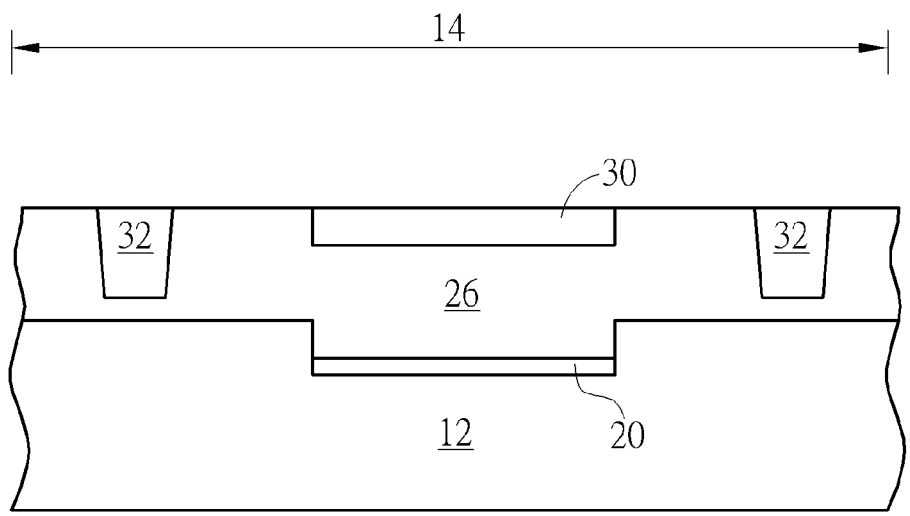

Next, as shown in FIG. 5, a gate dielectric layer 30 is formed in the second recess 28 and a plurality of shallow trench isolations (STIs) 32 are formed in the epitaxial layer 26, in which the gate dielectric layer 30 preferably serves as a gate dielectric layer for high-voltage semiconductor device while the STIs 32 are used to isolate high-voltage semiconductor devices from adjacent low-voltage devices. In this embodiment, the formation of the gate dielectric layer 30 could be accomplished by carrying out a thermal oxidation process, or an in-situ steam growth (ISSG) process to form the gate dielectric layer 30 composed of oxides in the second recess 28. The formation of the STIs 32 could be accomplished by sequentially depositing a first liner (not shown) composed of silicon nitride and a second liner (not shown) composed of silicon oxide on the surface of epitaxial layer 26, and then conducting a photo-etching process to remove part of the second liner, part of the first liner, and part of the epitaxial layer 26 for forming recesses used to form STIs 32. Next, oxides are deposited into the recesses and a planarizing process is conducted to remove part of the oxides, second liner, and first liner to form the STIs 32, in which the top surfaces of the STIs 32, gate dielectric layer 30, and epitaxial layer 26 are coplanar.

Figure 6:
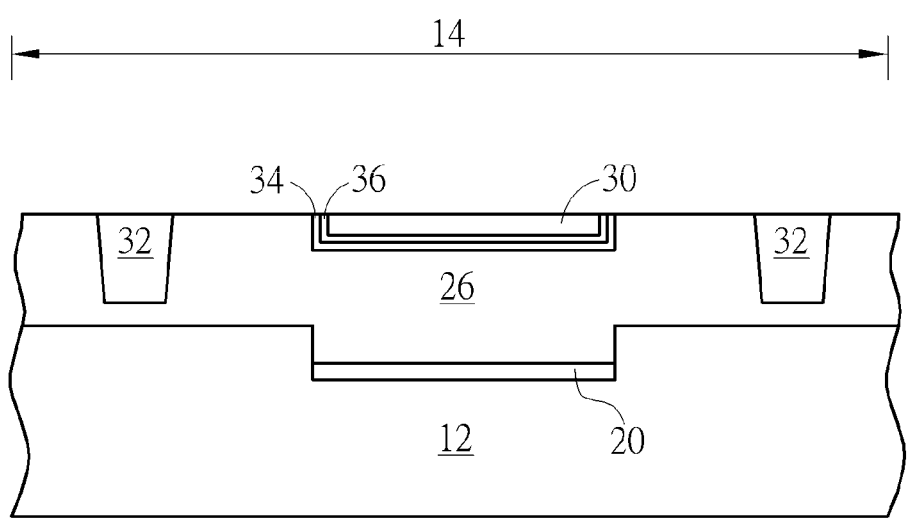

It should be noted that instead of forming the STIs 32 after forming the gate dielectric layer 30 as disclosed above, it would also be desirable to form STIs 32 in the epitaxial layer 26 as well as forming doping wells (not shown) before forming the gate dielectric layer 30 in the second recess 28. For instance, as shown in FIG. 6, a first liner 34 composed of silicon nitride and a second liner 36 composed of silicon oxide could be sequentially deposited on the epitaxial layer 26 surface and filled into the second recess 28, and a photo-etching process is conducted to remove part of the second liner 36, part of the first liner 34, and part of the epitaxial layer 26 adjacent to the second recess 28 to form recesses used for forming STIs 32 while none of the first liner 34 and second liner 36 within the second recess 28 is removed. Next, oxides are filled into the recesses and a planarizing process is conducted thereafter to remove part of the oxides, second liner 36, and first liner 34 on epitaxial layer 26 surface to form STIs 32, in which the top surfaces of the STIs 32, gate dielectric layer 30, and epitaxial layer 26 are coplanar. Since the first liner 34 and second liner 36 used to form recesses for STIs 32 are deposited into the second recess 28 before the gate dielectric layer 30 is formed, the first liner 34 and second liner 36 formed between the gate dielectric layer 30 and the epitaxial layer 26 are preferably U-shaped.

Figure 7:
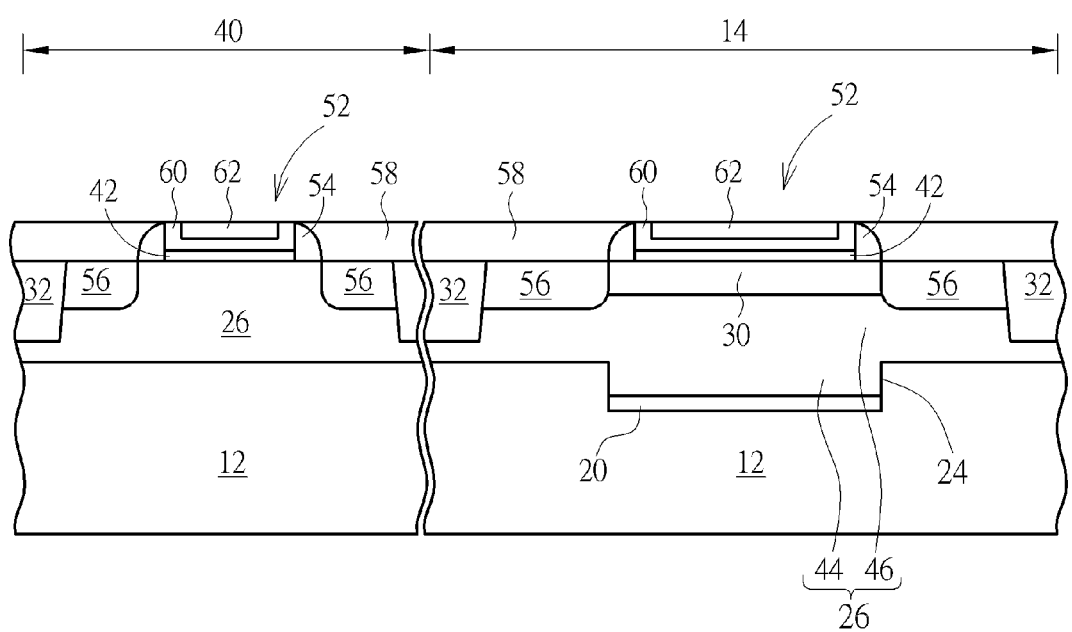

Next, as shown in FIG. 7, after STIs are fabricated as shown in FIG. 5, fabrication of transistors could be carried out in both HV region 14 and low-voltage (LV) region 40. For instance, an oxide layer 42 could be formed on both the LV region 40 and HV region 14, and gate structures 52 are formed on the oxide layer 42 of each LV region 40 and HV region 14, in which the top surfaces of the gate structures 52 on LV region 40 and HV region 14 are coplanar.

In this embodiment, the fabrication of the gate structures 52 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the epitaxial layer 26 of LV region 40 and HV region 14, and a spacer 54 is formed on the sidewalls of each dummy gate. Source/drain regions 56 are then formed in the epitaxial layer 26 adjacent to two sides of the spacer 54, a contact etch stop layer (CESL) (not shown) is formed on the dummy gates, and an interlayer dielectric (ILD) layer 58 composed of tetraethyl orthosilicate (TEOS) is formed on the CESL.

Next, a replacement metal gate (RMG) process could be conducted to planarize part of the ILD layer 58 and CESL and then transforming the dummy gate into a metal gate. The RMG process could be accomplished by first performing a selective dry etching or wet etching process, such as using etchants including ammonium hydroxide (NH$_4$OH) or tetramethylammonium hydroxide (TMAH) to remove the polysilicon layer from dummy gates for forming recesses (not shown) in the ILD layer 58. Next, a conductive layer including at least a U-shaped work function metal layer 60 and a low resistance metal layer 62 is formed in the recesses, and a planarizing process is conducted so that the surfaces of the U-shaped work function layer 60 and low resistance metal layer 62 are even with the surface of the ILD layer 58. This forms a gate electrode of the gate structure 52. In addition, it would also be desirable to form STIs in the epitaxial layer 26 adjacent to two sides of the gate structure 52 on HV region 14, in which the STIs are preferably between the gate dielectric layer 30 and the source/drain region 56. Depending on the nature of the device, it would also be desirable to form one single STI in the epitaxial layer 26 adjacent to one side of the gate structure 52 on HV region 14, or as shown in FIG. 7, only a thick and planar gate dielectric layer 30 is completely embedded in the epitaxial layer 26 above the substrate 12 on HV region 14.

In this embodiment, the work function metal layer 60 is formed for tuning the work function of the later formed metal gates to be appropriate in an NMOS or a PMOS. For an NMOS transistor, the work function metal layer 60 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 60 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 60 and the low resistance metal layer 62, in which the material of the barrier layer may include titanium (Ti), titanium nitride (TiN), tantalum (Ta) or tantalum nitride (TaN). Furthermore, the material of the low-resistance metal layer 62 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Referring again to FIG. 7, a semiconductor device structure is further disclosed, which preferably includes a high-voltage device disposed on a HV region 14 and a low-voltage device disposed on a LV region 40. The HV device disposed on HV region 14 preferably includes a doped region 20 embedded in a substrate 12, a recess 24 in the substrate 12, an epitaxial layer 26 disposed on the doped region 20 and the substrate 12, a gate dielectric layer 30 embedded in the epitaxial layer 26, and a gate structure 52 disposed on the gate dielectric layer 30. The epitaxial layer 26 further includes a first portion 44 embedded within the recess 24 of the substrate 12 and a second portion 46 disposed on the substrate 12 and the first portion 44.

Viewing from another perspective, the top surface of the doped region 20 is preferably lower than the top surface of the substrate 12, the gate dielectric layer 30, source/drain region 56, and STIs 32 are all disposed in the second portion 46 of the epitaxial layer 26, in which the top surfaces of the STIs 32, gate dielectric layer 30, and source/drain region 56 are coplanar. Since the source/drain region 56 is disposed in the epitaxial layer 26, the top surface of the STIs 32 is also even with the top surface of the second portion 46 of epitaxial layer 26 within the source/drain region 56.

Overall, the present invention first forms a doped region on a HV region of a substrate and then conducts a thermal oxidation process to form a thermal oxide layer on the substrate and doped region. The formation of the thermal oxide layer preferably moves the doped region downward so that the top surface of the doped region is lower than the substrate surface around the doped region. After removing the thermal oxide layer to form a recess, an epitaxial layer is formed on the substrate and filled into the recess, and a dielectric layer is formed in the epitaxial layer thereafter. Since the recess formed during the removal of thermal oxide layer facilitates the formation of another corresponding recess in the epitaxial layer, the gate dielectric layer formed afterwards could be filled completely into the recess in the epitaxial layer so that the surfaces of the gate dielectric layer and epitaxial layer could be coplanar. By having gate dielectric layer fully embedded in the epitaxial layer, the metal gate formed atop the gate dielectric layer on HV region could be protected from being planarized during CMP process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a doped region in the substrate;
   forming a thermal oxide layer on the substrate and the doped region;
   removing the thermal oxide layer to form a first recess;
   forming an epitaxial layer on the substrate and in the first recess after removing the thermal oxide layer; and
   forming a gate dielectric layer in the epitaxial layer.

2. The method of claim 1, wherein the doped region comprises an n+ buried layer (NBL).

3. The method of claim 1, further comprising forming the doped region in the substrate so that the top surface of the doped region is even with the top surface of the substrate.

4. The method of claim 1, further comprising performing a thermal oxidation process to form the thermal oxide layer and push the doped region downward so that the top surface of the doped region is lower than the top surface of the substrate around the doped region.

5. The method of claim 4, wherein the temperature of the thermal oxidation process is greater than 1000° C.

6. The method of claim 1, further comprising forming the epitaxial layer on the substrate and into the first recess while forming a second recess in the epitaxial layer and atop the doped region.

7. The method of claim 6, wherein the depth of the second recess is equivalent to the depth of the first recess.

8. The method of claim 6, further comprising forming the gate dielectric layer in the second recess.

9. The method of claim 1, further comprising forming a shallow trench isolation (STI) in the epitaxial layer before forming the gate dielectric layer.

10. The method of claim 1, further comprising forming a shallow trench isolation (STI) in the epitaxial layer after forming the gate dielectric layer.

11. The method of claim 1, further comprising:
    forming a gate structure on the gate dielectric layer; and
    performing a replacement metal gate (RMG) process to transform the gate structure into a metal gate.

12. A semiconductor device, comprising:
    a substrate;
    a recess in the substrate;
    an epitaxial layer in the recess and on the substrate, wherein the epitaxial layer comprises:
       a first portion embedded in the recess; and
       a second portion on the substrate; and
    a gate dielectric layer on the first portion of the epitaxial layer.

13. The semiconductor device of claim 12, further comprising a doped region embedded in the substrate, wherein the top surface of the doped region is lower than the top surface of the substrate.

14. The semiconductor device of claim 13, wherein the doped region comprises an n+ buried layer (NBL).

15. The semiconductor device of claim 12, wherein the top surface of the gate dielectric layer and the top surface of the second portion of the epitaxial layer are coplanar.

16. The semiconductor device of claim 12, further comprising a shallow trench isolation (STI) embedded in the second portion of the epitaxial layer.

17. The semiconductor device of claim 16, wherein the top surfaces of the STI, the gate dielectric layer, and the second portion of the epitaxial layer are coplanar.

18. The semiconductor device of claim 12, further comprising a metal gate on the gate dielectric layer.

* * * * *